US011349480B2

(12) United States Patent
Gaul et al.

(10) Patent No.: US 11,349,480 B2
(45) Date of Patent: May 31, 2022

(54) CIRCUITS BASED ON MAGNETOELECTRIC TRANSISTOR DEVICES

(71) Applicant: Board of Regents of the University of Nebraska, Lincoln, NE (US)

(72) Inventors: Nishtha Sharma Gaul, Richardson, TX (US); Andrew Marshall, Dallas, TX (US); Peter A. Dowben, Crete, NE (US); Dmitri E. Nikonov, Beaverton, OR (US)

(73) Assignees: BOARD OF REGENTS, THE UNIVERSITY OF TEXAS SYSTEM, Austin, TX (US); BOARD OF REGENTS OF THE UNIVERSITY OF NEBRASKA, Lincoln, NE (US); INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/581,691

(22) Filed: Sep. 24, 2019

(65) Prior Publication Data
US 2020/0099379 A1    Mar. 26, 2020

Related U.S. Application Data

(60) Provisional application No. 62/735,495, filed on Sep. 24, 2018.

(51) Int. Cl.
*H03K 19/16* (2006.01)
*H01L 29/423* (2006.01)
(Continued)

(52) U.S. Cl.
CPC ....... *H03K 19/16* (2013.01); *H01L 29/42312* (2013.01); *H03K 19/10* (2013.01); *H03K 19/21* (2013.01)

(58) Field of Classification Search
CPC .. G11C 14/0081; G11C 11/419; H03K 19/16; H03K 19/10; H03K 19/21; H03K 19/18;
(Continued)

(56) References Cited

U.S. PATENT DOCUMENTS 6,140,838 A * 10/2000 Johnson ................ G11C 11/16
326/136
9,276,040 B1 * 3/2016 Marshall ................ H01L 43/08
(Continued)

FOREIGN PATENT DOCUMENTS

WO    WO-2019005175 A1 *    1/2019    ............. H01L 43/08

OTHER PUBLICATIONS

Dowben et al. "Towards a Strong Spin-Orbit Coupling Magnetoelectric Transistor" IEEE Journmal on Explorator Solid-State Computations Devices and Circuits, vol. 4, https://www.eng.buffalo.edu/~uttamsin/JESSCD_2018.pdf (Year: 2018).*

*Primary Examiner* — Seokjin Kim
(74) *Attorney, Agent, or Firm* — Talem IP Law, LLP

(57) ABSTRACT

Logic circuits constructed with magnetoelectric (ME) transistors are described herein. A ME logic gate device can include at least one conducting device, for example, at least one MOS transistor; and at least one ME transistor coupled to the at least one conducting device. The ME transistor can be a ME field effect transistor (ME-FET), which can be can be an anti-ferromagnetic spin-orbit read (AFSOR) device or a non-AFSOR device. The gates and logic circuits described herein can be included as standard cells in a design library. Cells of the cell library can include standard cells for a ME inverter device, a ME minority gate device, a ME majority gate device, a ME full adder, a ME XNOR device, a ME XOR device, or a combination thereof.

9 Claims, 16 Drawing Sheets

(51) Int. Cl.
*H03K 19/10* (2006.01)
*H03K 19/21* (2006.01)

(58) Field of Classification Search
CPC .......................... H03K 19/00; H03K 19/168; H01L 29/42312; H01L 21/823462; H01L 21/823857; H01L 27/0922; H01L 43/00; H01L 29/423; H01L 29/66984; H01L 27/228; H01L 27/22
See application file for complete search history.

(56) References Cited

U.S. PATENT DOCUMENTS

| | | | |
|---|---|---|---|
| 9,300,295 B1* | 3/2016 | Zhang | G11C 11/1675 |
| 9,368,208 B1* | 6/2016 | Marshall | G11C 14/0081 |
| 9,503,085 B1* | 11/2016 | Bird | H01L 43/08 |
| 2014/0231888 A1* | 8/2014 | Kelber | G11C 11/5607 |
| | | | 257/295 |
| 2014/0327471 A1* | 11/2014 | Hsieh | G06F 30/39 |
| | | | 326/101 |
| 2017/0093398 A1* | 3/2017 | Bird | H03K 19/16 |
| 2017/0372761 A1* | 12/2017 | Lee | H01L 27/228 |
| 2018/0248554 A1* | 8/2018 | Pan | H01L 27/222 |
| 2020/0091414 A1* | 3/2020 | Liu | G11C 11/2275 |
| 2020/0099379 A1* | 3/2020 | Sharma | H03K 19/16 |

* cited by examiner

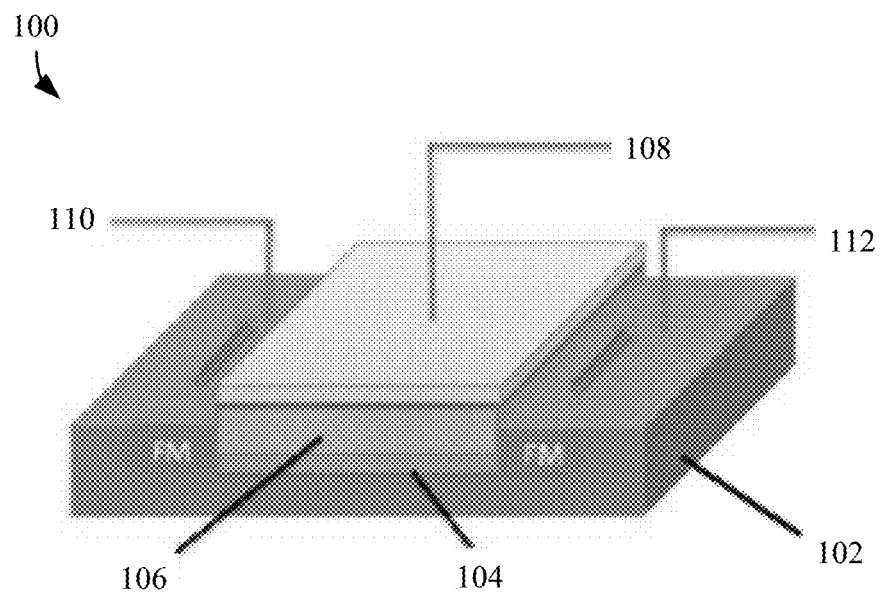
Figure 1A – PRIOR ART
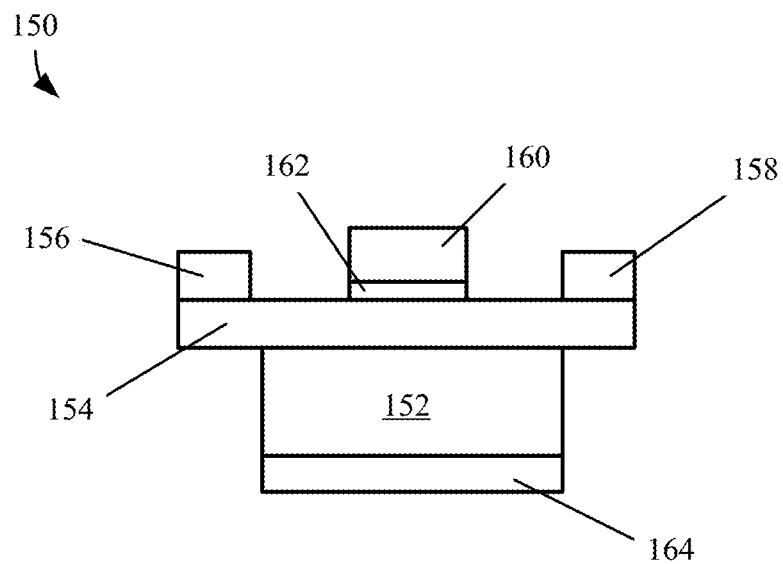
Figure 1B – PRIOR ART

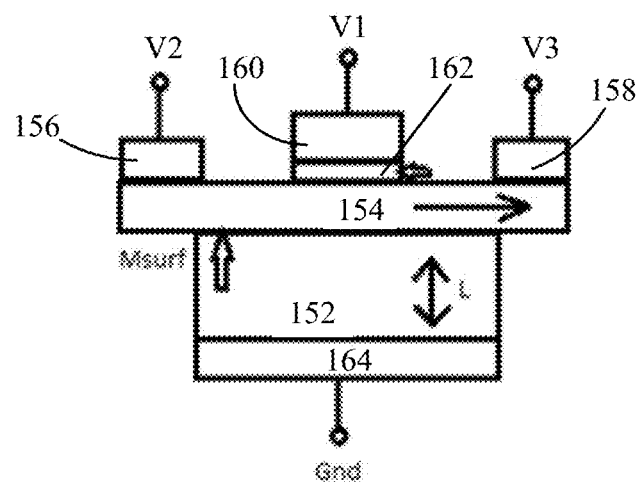
Figure 1C – PRIOR ART
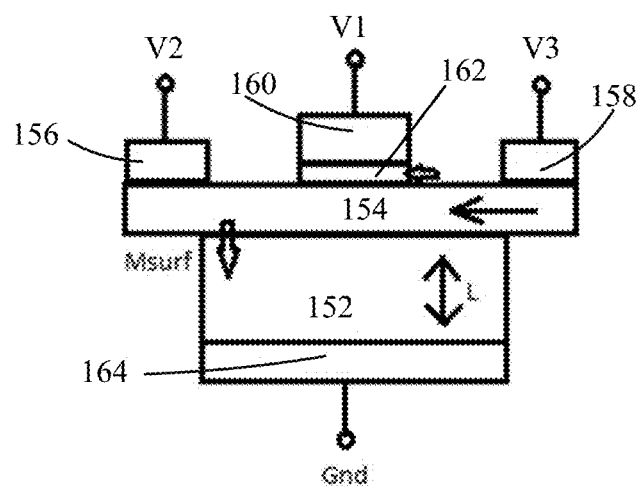
Figure 1D – PRIOR ART

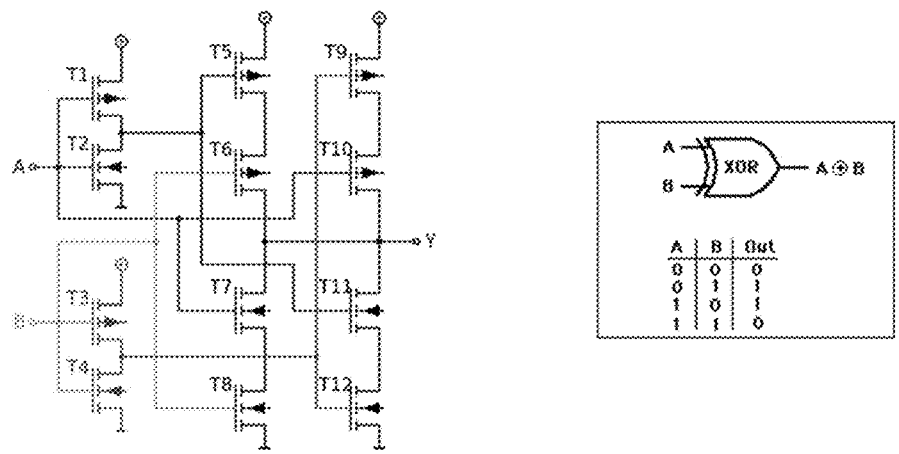
Figure 7A – PRIOR ART
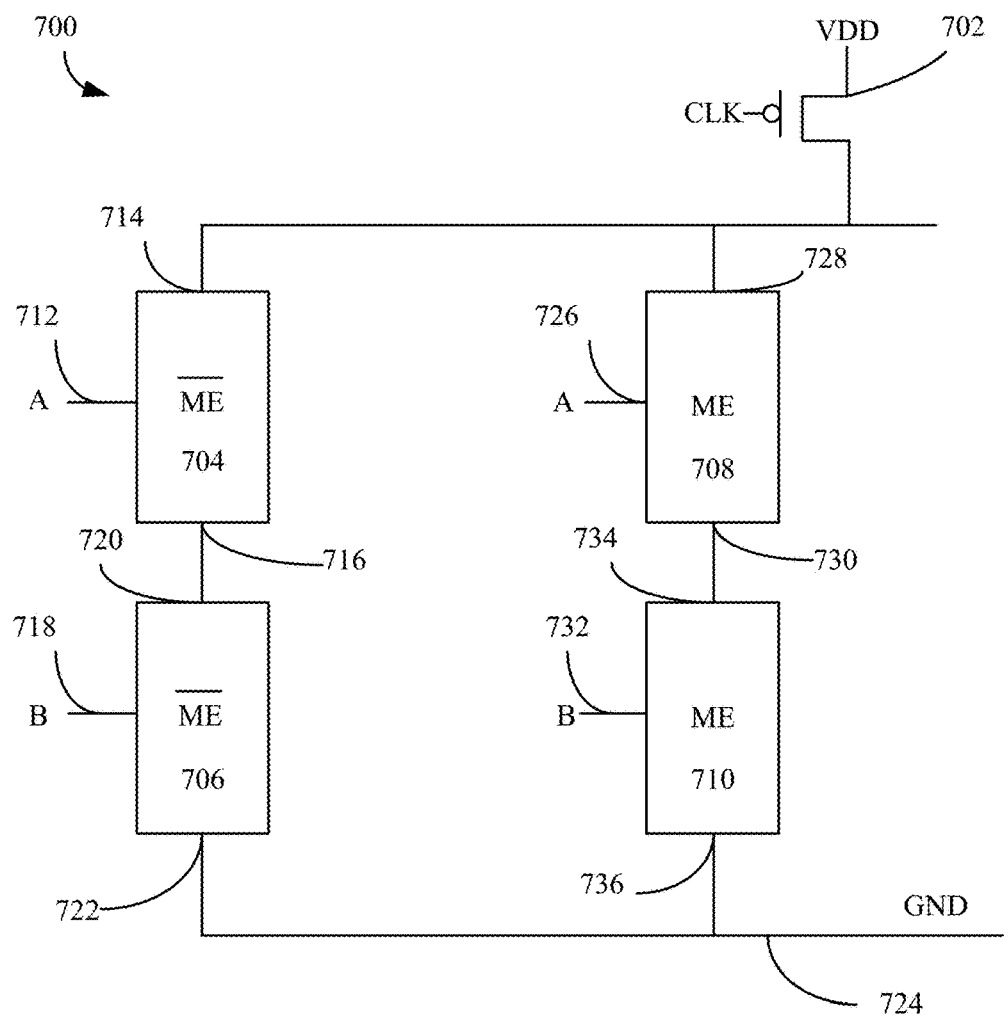
Figure 7B

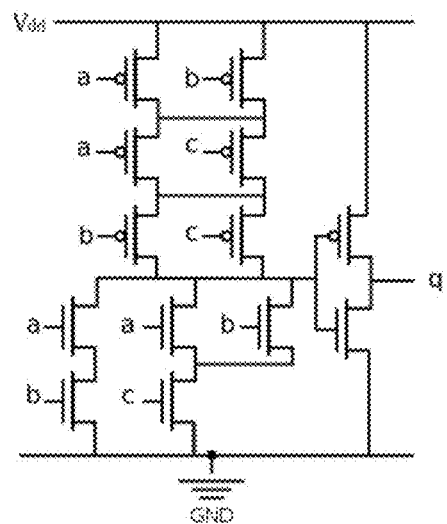
Figure 9A – PRIOR ART
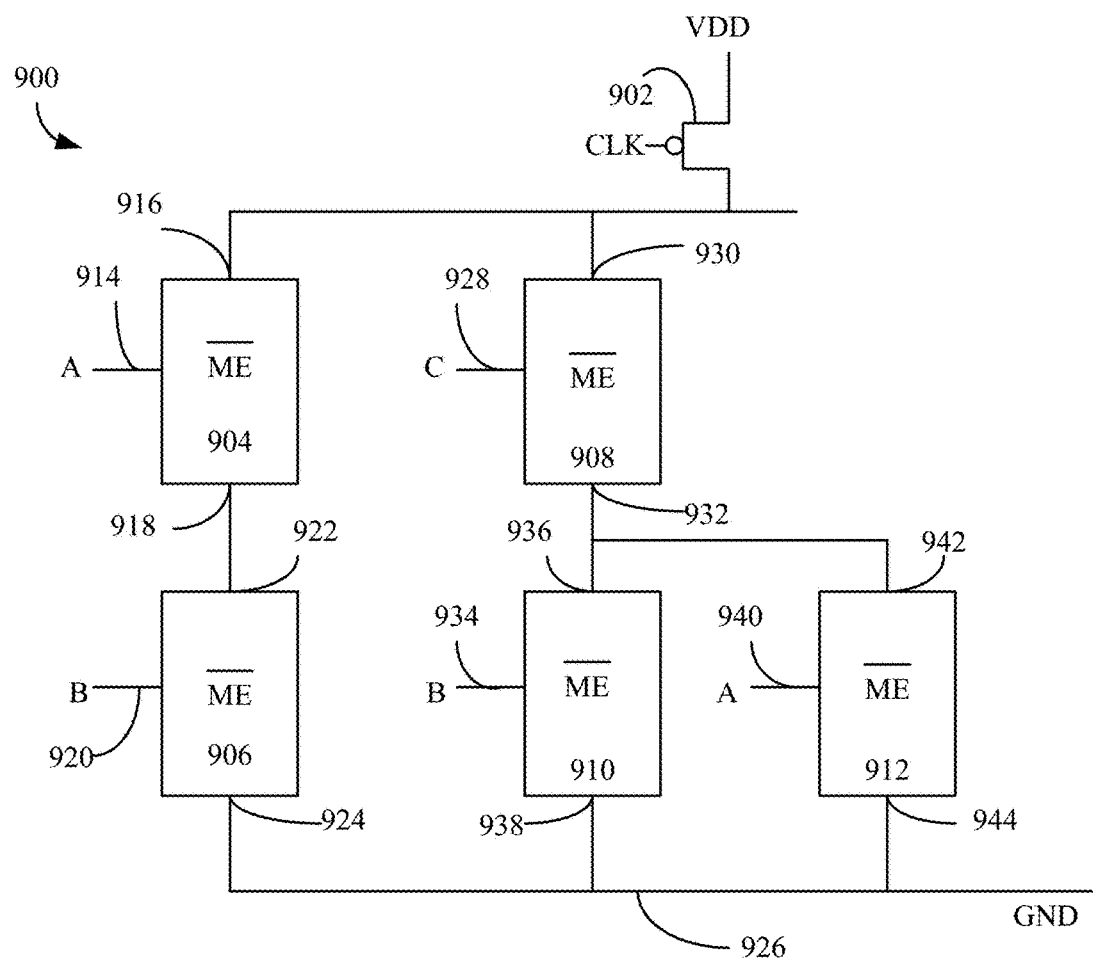
Figure 9B

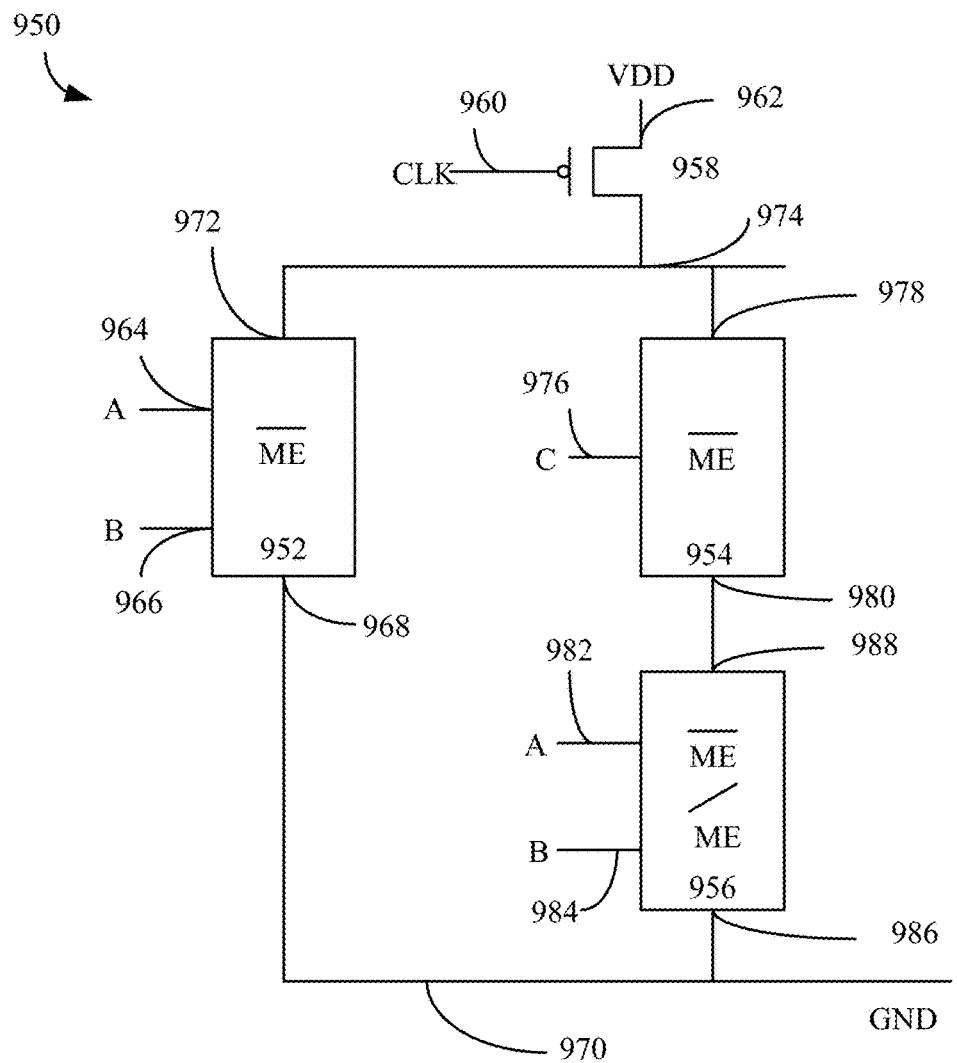
Figure 9C
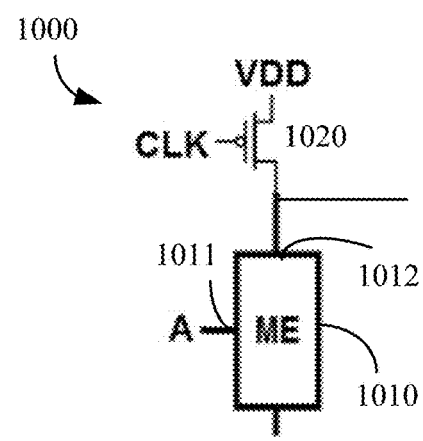
Figure 10
Figure 9D

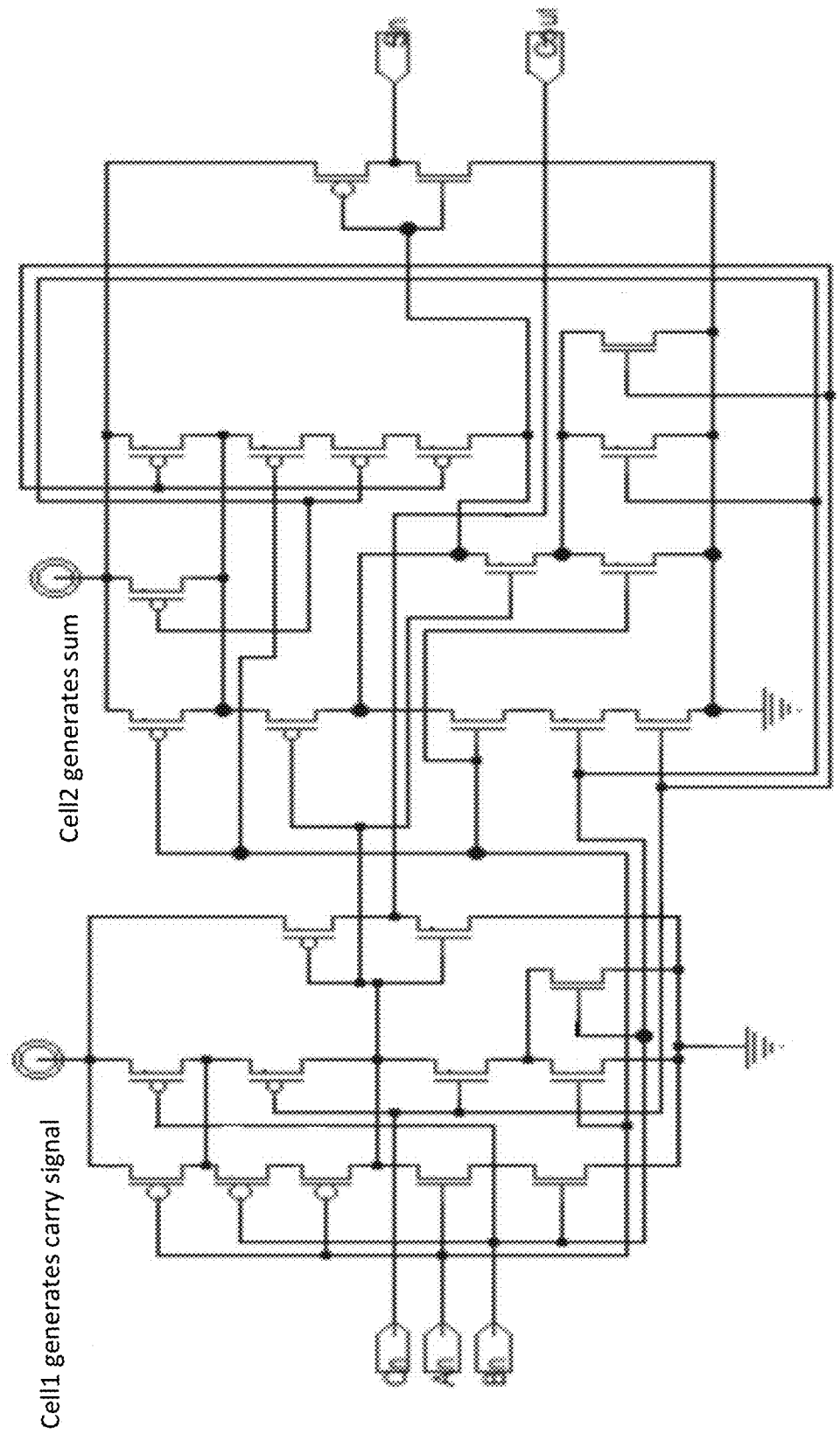
Figure 11A – PRIOR ART

CIRCUITS BASED ON MAGNETOELECTRIC TRANSISTOR DEVICES

CROSS REFERENCE TO RELATED APPLICATION(S)

This application claims the benefit of U.S. Provisional Application Ser. No. 62/735,495, filed Sep. 24, 2018.

STATEMENT REGARDING FEDERALLY SPONSORED RESEARCH

This invention was made with government support under ECCS1740136 awarded by the National Science Foundation, 70NANB17H041 awarded by the National Institute of Standards and Technology, and HR0011-18-3-0004 awarded by the Department of Defense/Defense Advanced Research Projects Agency (DARPA). The government has certain rights in the invention.

BACKGROUND

Power consumption continues to be a driver for development in memory and logic circuits. To that end, research in magnetoelectric systems with electrical control of magnetic properties including, but not limited to, spin polarization, magnetic ordering, and magnetic anisotropy, has resulted in identification of device structures with behavior that indicate the suitability of magnetoelectric devices as a practical alternative to conventional CMOS (complementary metal oxide semiconductor) devices.

With the identification of magnetoelectric device structures, attention has now turned to how to use and configure these devices for logic operations.

BRIEF SUMMARY

Circuits based on magnetoelectric (ME) transistor devices are described herein. ME transistor devices can be in the form of ME field-effect transistors (ME-FETs). The ME-FETs can be anti-ferromagnetic spin-orbit read (AFSOR) devices or non-AFSOR devices. The circuits described herein can form logic gates (e.g., inverter, XOR, XNOR, majority gate), which can further be combined, and even optimized, to form a variety of more complex logic circuits such as a full adder.

The gates and logic circuits described herein can be included as standard cells in a design library. For example, a computer-readable storage medium can have stored thereon a cell library, where the cell library includes instructions for representing and optionally simulating devices when executed by a computing device. Cells of the cell library can include standard cells for a ME inverter device, a ME minority gate device, a ME majority gate device, a ME full adder, a ME XNOR device, a ME XOR device, or a combination thereof.

In some cases, a ME logic gate device can include at least one conducting device; and at least one ME transistor coupled to the at least one conducting device. The conducting device can include two-terminal devices such as a resistor as well as multi-terminal devices such as MOS, bipolar transistors and ME-FET.

In some cases, the ME logic gate device can include at least one CMOS logic gate, such as a CMOS inverter; and at least one ME transistor coupled to the CMOS logic gate.

In some cases, a CMOS inverter can be coupled to a source terminal of a ME transistor in order to drive the ME transistor.

A ME-XNOR device is provided that includes a conducting device and a ME transistor. When the conducting device is in the form of a pull-up transistor, the pull-up transistor can be coupled to receive a clocking signal at a gate terminal and coupled at a source terminal to a voltage source. The ME transistor can include a split gate, with a first gate terminal coupled to a first portion of the split gate for receiving a first input signal, a second gate terminal coupled to a second portion of the split gate for receiving a second input signal, a source terminal coupled to a ground line, and a drain terminal coupled to a drain terminal of the pull-up transistor.

A ME majority gate device is provided that includes a conducting device, a ME AND gate device, a ME-transmission gate, and a ME-XNOR gate device. When the conducting device is in the form of a pull-up transistor, the pull-up transistor can be coupled to receive a clocking signal at a gate terminal and coupled at a source terminal to a voltage source. The ME AND gate has a downward interface polarization and can include a gate, a first terminal coupled to the gate for receiving a first input signal, a second terminal coupled to the gate for receiving a second input signal, a source terminal coupled to a ground line, and a drain terminal coupled to a drain terminal of the pull-up transistor. The ME-transmission gate also has downward interface polarization and can include a gate terminal coupled to receive a third input signal, a drain terminal coupled to the drain of the pull-up transistor, and a source terminal. The ME-XNOR gate device can include a split gate with a first gate terminal coupled to a first portion of the split gate for receiving the first input signal, a second gate terminal coupled to a second portion of the split gate for receiving the second input signal, a source terminal coupled to the ground line, and a drain terminal coupled to the source terminal of the ME-transmission gate device.

A ME full adder device is provided that can include a ME majority gate device and a stacked ME-XNOR device. The ME majority gate device can be coupled to receive a first input signal, a second input signal, and a third input signal and output a "carry" signal. The stacked ME-XNOR device can include a first ME-XNOR device and a second ME-XNOR device. The first ME-XNOR device can be coupled to receive the first input signal and second input signal and output an intermediate signal. The second ME-XNOR device can be coupled to receive a third input signal and the intermediate signal and output a "sum" signal.

This Summary is provided to introduce a selection of concepts, in a simplified form, that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 1A shows a representation of a basic ME-FET.

FIG. 1B shows a representation of a ME spin-FET.

FIGS. 1C and 1D illustrate an operation of a ME spin-FET as shown in FIG. 1B configured with large spin orbit coupling.

FIG. 5A indicates upward interface polarization and FIG. 5B indicates downward interface polarization.

FIG. 7A shows a prior art implementation of a CMOS XOR circuit.

FIG. 7B shows an equivalent circuit to the circuit of FIG. 7A using ME-FET devices.

FIG. 9A shows a prior art implementation of a CMOS majority gate logic circuit.

FIG. 9B shows an equivalent circuit using ME-FET devices.

FIG. 9C shows a truth table for a majority gate logic device.

FIG. 9D shows an example implementation of the majority gate logic device of FIG. 9B with component reduction.

FIG. 10 shows a single source ME-FET inverter.

FIG. 11A shows a prior art implementation of a full adder using CMOS.

DETAILED DESCRIPTION

Figure 2:
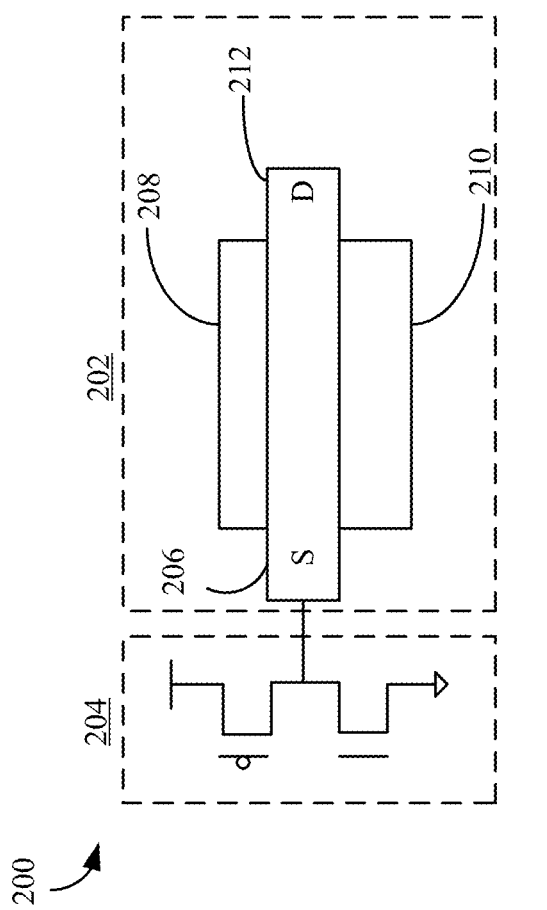
FIG. 2 shows an example implementation of a circuit element formed of an AFSOR device with driving transistors.

Circuits based on magnetoelectric (ME) transistor devices are described herein. ME transistor devices can be in the form of ME field-effect transistors (ME-FETs). In some cases, a ME logic gate device can include at least one conducting device; and at least one ME-FET coupled to the at least one conducting device. The conducting device illustrated herein is a MOS transistor; however, the conducting device may alternatively be implemented using two-terminal devices such as a resistor or multi-terminal devices such as the MOS transistor, bipolar transistors, and even another ME-FET providing a pull-up. In some cases, the ME logic gate device can include at least one CMOS logic gate, such as a CMOS inverter; and at least one ME-FET coupled to the CMOS logic gate. In some cases, a CMOS inverter can be coupled to a source terminal of a ME-FET in order to drive the ME-FET (e.g., as a driving transistor pair). In any case, the ME logic gate devices incorporates at least one electrically connected input and at least one conductive output.

ME-FETs can be a practical alternative to conventional CMOS devices. ME-FET devices can be used in logic and memory applications by providing a nonvolatile way to store states, and the read and write process could be much faster than other devices that use ferromagnetism since switching of a ferromagnet is not required. Indeed, by adopting a transistor geometry, based solely on the switching of a ME material, switching speed can be limited only by the switching dynamics of that material instead of having to rely on the slower switching delay of a ferromagnetic layer found in magnetic tunnel junction devices Accordingly, ME-FETs can be implemented in various circuit designs to improve circuit area, power consumption, and delay time. Circuit cells incorporating ME-FETs can also be used in a standard cell library in addition to conventional technologies such as CMOS for circuit layout tools.

A ME-FET can have its computational state stored as an anti-ferromagnetic (AFM) single domain state (with a concomitant specific boundary polarization), with magneto-electric switching of AFM order as voltage is applied. The device's semiconductor channel can be material with or without large spin orbit coupling (SOC), where AFM's surface magnetization controls transport in the channel (e.g., high resistance in one direction and low resistance in the other). A ME-FET that comprises an antiferromagnetic (AFM) magneto-electric (ME) layer, rather than a ferromagnetic layer, reduces the delay time of the device write operation and is not constrained by the long delay time required to switch a ferromagnetic layer. Additionally, the applied magnetic field of the ME device is static and has no constraints, so the voltage can be adjusted by the circuit designer to the best value for logic and memory.

FIG. 1A shows a representation of a basic ME-FET; and FIG. 1B shows a representation of a ME spin-FET. Referring to FIG. 1A, a ME-FET 100 can include a bottom gate 102, a narrow channel conductor layer 104 on the bottom gate 102, a ME layer 106 on the narrow channel conductor layer 104, and a gate electrode 108 on the ME layer 106. A ferromagnetic source terminal 110 can be located at a side of the narrow channel conductor layer 104. A ferromagnetic drain terminal 112 can be located at another side of the narrow channel conductor layer 104. The basic ME-FET may look similar to an NMOS transistor, though versions can be made that act as either inverting or buffer gates as discussed in detail below.

Referring to FIG. 1B, the ME-FET may be configured as an anti-ferromagnetic magneto-electric spin-orbit read (AFSOR) device. In an AFSOR device, the semiconductor channel layer has large spin orbit coupling. As shown in FIG. 1B, a ME-FET 150 can be of the AFSOR type (also referred to as a ME spin-FET) and includes a ME layer 152, a spin-orbit coupling material layer 154 on the ME layer 152; and a source contact 156, a drain contact 158, and a gate contact 160 on the spin-orbit coupling layer 154. A dielectric layer 162 is disposed between the gate contact 160 and the spin-orbit coupling layer 154. The ME layer 152 can be an insulating dielectric layer composed of, for example, chromia.

FIGS. 1C and 1D illustrate an operation of a ME spin-FET as shown in FIG. 1B configured with large spin orbit coupling. FIG. 1C shows a boundary (i.e., interface) polarization of the device when a positive voltage is applied to the top gate and the bottom gate is tied to ground. FIG. 1D shows a boundary polarization of the device when a negative voltage is applied to the top gate and the bottom gate is tied to ground. Referring to FIGS. 1C and 1D, for operation, the gate contact 160 may be connected to a first voltage source V1, the source contact 156 may be connected to a second voltage source V2, the drain contact 158 may be connected to a third voltage source V3, and the magneto-electric layer 152 may be connected to ground (or other potential) via a metal contact layer 164 (as a bottom gate electrode). The arrow within the SOC layer 154 illustrates the direction of current flow through the channel as it relates to the applied voltage. The direction of surface magnetization, $M_{surf}$, is also shown as an arrow to indicate direction as it relates to applied voltage. As shown in FIG. 1C, when a positive voltage is applied at V1, current flows towards the right and $M_{surf}$ is pointing up. As shown in FIG. 1D, when a negative voltage is applied at V1, current flows towards the left and $M_{surf}$ is pointing down.

The circuits described herein can be implemented using ME-FETs that are AFSOR devices or non-AFSOR devices. In addition, a combination of ME-FET and CMOS devices can be utilized.

FIG. 2 shows an example implementation of a circuit element formed of an AFSOR device with driving transistors. Referring to FIG. 2, a circuit element 200 can include an AFSOR device 202 and a driving transistor pair 204, which supplies power to the AFSOR device 202. The source terminal 206 of the AFSOR device 202 is coupled to the output of the driving transistor pair 204. During operation of the circuit element 200, a voltage, Vgb, can be applied between the gate terminal 208 and the base terminal 210 of the AFSOR device 202. If Vgb>0, current will flow from the drain 212 to the source 206 and can be represented as Isd<0. If Vgb<0, current will flow from the source 206 to the drain 212 and can be represented as Isd>0.

Figure 3A:
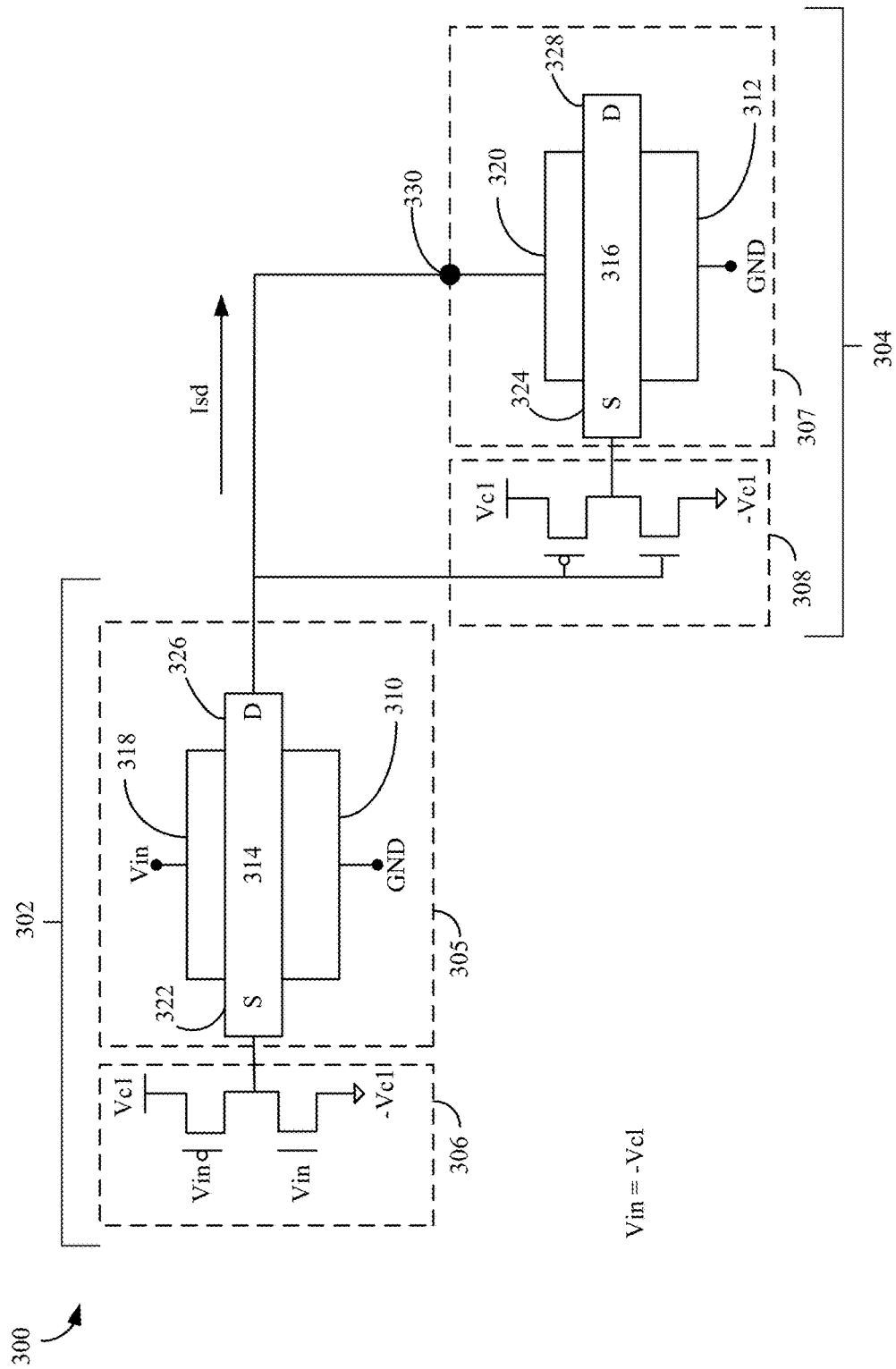
FIGS. 3A and 3B show an example implementation of a ME logic circuit using AFSOR devices to perform an inverter operation.
Figure 3B:
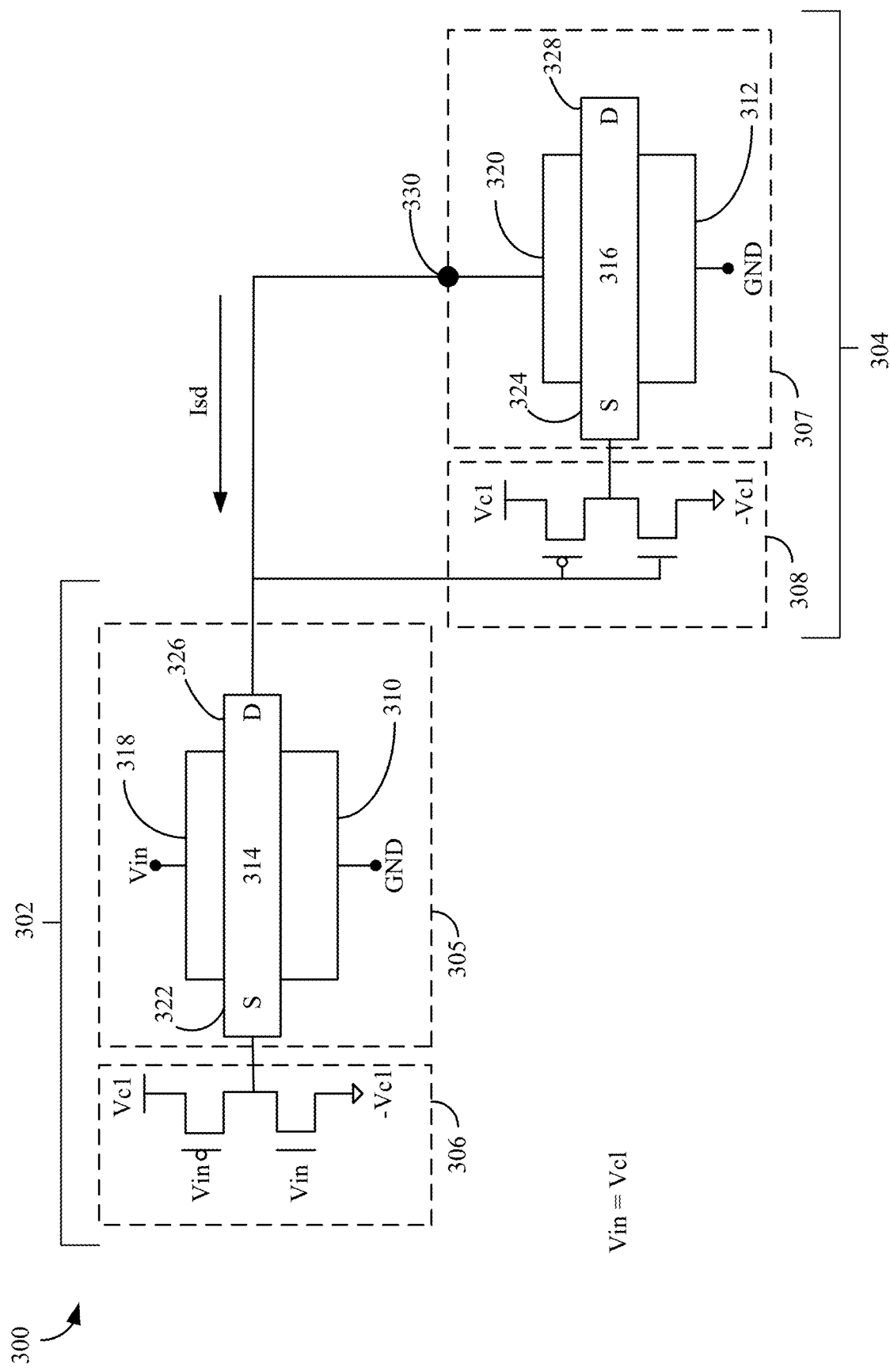

Combining multiple AFSOR circuit elements 200, shown in FIG. 2, can produce various logic operations. FIGS. 3A and 3B show an example implementation of a ME logic circuit using AFSOR devices to perform an inverter operation. FIG. 3A illustrates the inverter operation when a first voltage is input to the circuit and FIG. 3B illustrates the inverter operation when a second voltage representing the opposite logic input value from the first voltage is input to the circuit. As shown in FIGS. 3A and 3B, a ME inverter device 300 can include two AFSOR circuit elements 302, 304, the first AFSOR circuit element including a first AFSOR device 305 and corresponding driving transistor pair 306 and the second AFSOR circuit element including a second AFSOR device 307 and corresponding driving transistor pair 308. Each AFSOR device, 305 and 307, can have a ME base layer 310 and 312, a semiconductor channel layer, 314 and 316, on the ME base layer, and a gate electrode, 318 and 320, on the semiconductor channel layer. The semiconductor channel layer, 314 and 316, can include a source terminal, 322 and 324, and a drain terminal 326 and 328. The source terminal, 322 and 324, for each AFSOR device, 305 and 307, respectively, is coupled to an output of a corresponding one of the two driving transistor pairs, 306 and 308. An input voltage, Vin, can be applied to the gate electrode 318 of the first AFSOR device 305. The two AFSOR devices, 305 and 307, are connected to each other with the gate electrode 320 of the second AFSOR device 307 coupled to the drain terminal 326 of the first AFSOR device 305.

Each driving transistor pair, 306 and 308, is connected to a complementary pair of pulsed voltage sources, Vc1, and −Vc1. That is, the PMOS transistor of the pair is coupled at its source to Vc1 and the NMOS transistor of the pair is coupled at its source to −Vc1. Each driving transistor pair can appear as a CMOS inverter. The first AFSOR circuit element 302 receives an input voltage Vin. Both the first driving transistor pair 306 and the gate electrode 318 of the first AFSOR device 305 receive the input voltage Vin. The second AFSOR circuit element 304 is coupled to receive the output from the drain of the first AFSOR device 305. Both the second driving transistor pair 308 and the gate electrode 320 receive the output from the drain of the first AFSOR device 305. Additionally, a base voltage can be applied to the ME base layer, 310 and 312; for example, the base voltage may be a ground voltage, such as at 0V. The direction of current flow in the circuit is dependent on the voltage applied to the gate terminal 318 of AFSOR device 305. For example, FIG. 3A shows the scenario when Vin=−Vc1, which results in Isd>0. The output value at node 330 rises to Vc1. In FIG. 3B, Vin=Vc1, which results in Isd<0. The output value at node 330 falls to −Vc1. The gate voltage, and thus the direction of the antiferromagnetic order and of the surface magnetization in the second AFSOR device 307, is the logical inverse of the corresponding parameters in the first AFSOR device 305. The current, Isd, flowing in the channel 314 of the first AFSOR device 305 charges the gate 320 of the second AFSOR device 307. Additional AFSOR circuit elements can be cascaded to follow the same pattern in which the current flowing from a first AFSOR device charges the gate of a subsequent AFSOR device.

Figure 4:
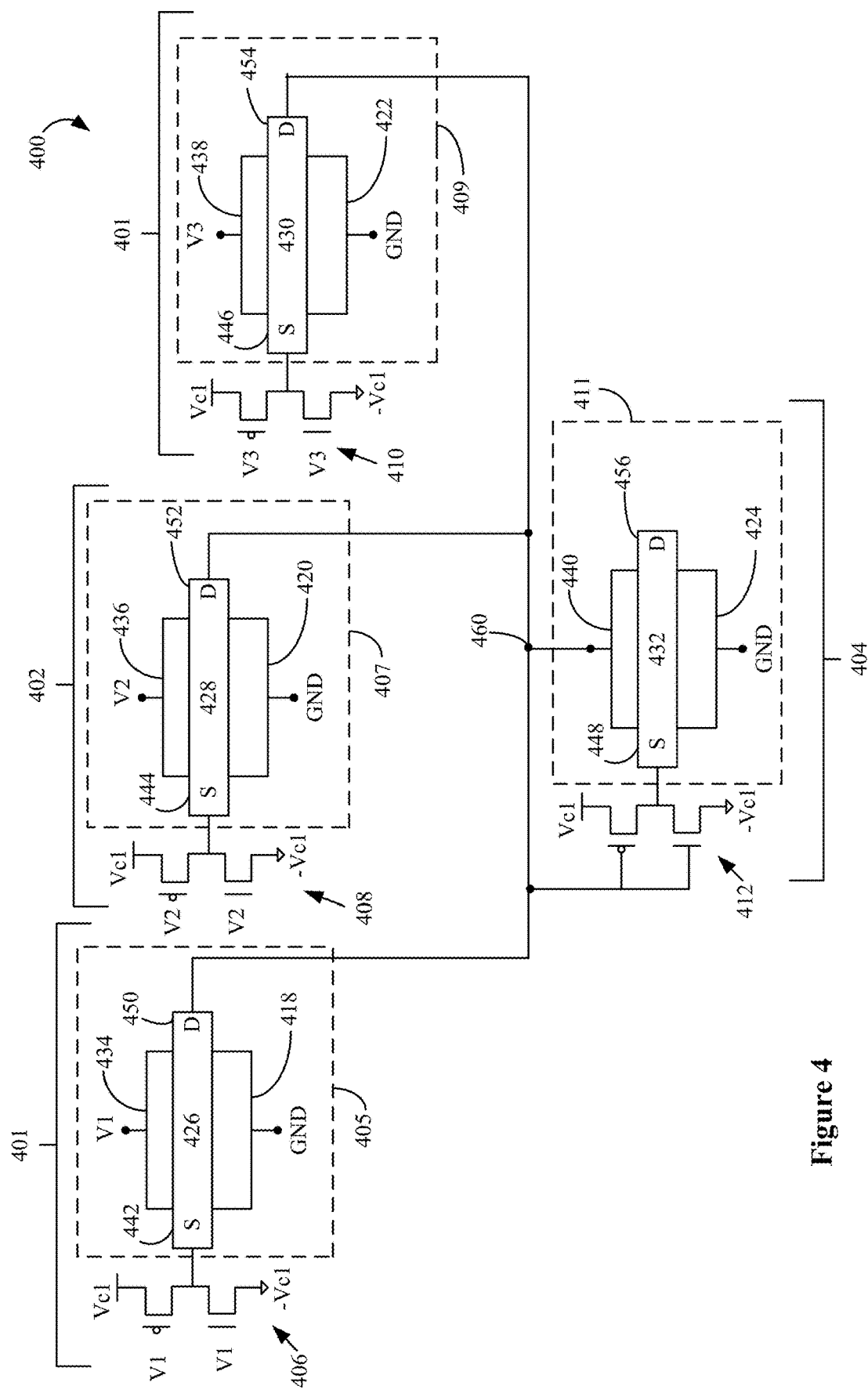
FIG. 4 shows an example implementation of a ME minority gate device using AFSOR devices.

Additional AFSOR circuit elements can be used to create more advanced logic operations. FIG. 4 shows an example implementation of a ME minority gate device using AFSOR devices. Referring to FIG. 4, a three input ME minority gate 400 can include four AFSOR circuit elements 401, 402, 403, 404. First input AFSOR circuit element 401 includes AFSOR device 405 and corresponding driving transistor pair 406; second input AFSOR circuit element 402 includes AFSOR device 407 and corresponding driving transistor pair 408; third input AFSOR circuit element 403 includes AFSOR device 409 and corresponding driving transistor pair 410; and fourth AFSOR circuit element 404 includes AFSOR device 411 and corresponding driving transistor pair 412. Each of the four AFSOR devices (405, 407, 409, 411) can have a ME base layer (418, 420, 422, 424), a semiconductor channel layer (426, 428, 430, 432) on the ME base layer and a gate electrode (434, 436, 438, 440) on the semiconductor channel layer. Each semiconductor channel layer (426, 428, 430, 432) can include a source terminal (442, 444, 446, 448) and a drain terminal (450, 452, 454, 456), respectively. The drain terminals (450, 452, 454) of each of the first three AFSOR devices (405, 407, 409) are coupled to the fourth AFSOR circuit element at the gates of the driving transistor pair 412 and the gate electrode 440 of AFSOR device 411. For minority gate operation, each driving transistor pair (406, 408, 410, 412) is connected to a complementary pair of pulsed voltage sources, Vc1, and −Vc1. That is, the PMOS transistor of each pair is coupled at its source to Vc1 and the NMOS transistor of each pair is coupled at its source to −Vc1. Each driving transistor pair can appear as a CMOS inverter.

During minority gate operation, a base ground voltage, 0V, can be applied to each of the four AFSOR devices (405, 407, 409, 411) at the ME base layer (418, 420, 422, 424). An input voltage, V1, V2, or V3, can be applied to the gate electrode (434, 436, 438) of each of the first three AFSOR devices (405, 407, 409), respectively. Additionally, the gates of each of the first three driving transistor pairs (410, 412, 414) are coupled to the input voltage of the corresponding AFSOR device, V1, V2, and V3, respectively. The output currents of each of the first three AFSOR devices (405, 407, 409) charge the gate 440 of the fourth AFSOR device 411. If the output currents from all three of the AFSOR devices (405, 407, 409) are in the same direction, a high voltage will be received by the fourth AFSOR device 411. If the output currents from the first three AFSOR devices (405, 407, 409) are not all flowing in the same direction, then a voltage received by the fourth AFSOR device 411 is determined by the net sum of the currents. The output voltage of the ME minority gate device 400 can be read at node 460.

The minority gate function is a logical inverse of a majority gate. Thus, a majority gate can also be implemented from the minority gate function by adding an inverter to the output (e.g., coupled to node 460) of the minority gate device (not shown). Using the above described minority gate and inverter allows a designer to build other logic functions. For example, the minority gate can reduce to either a NAND gate or NOR gate by fixing one of the inputs.

Figure 5A:
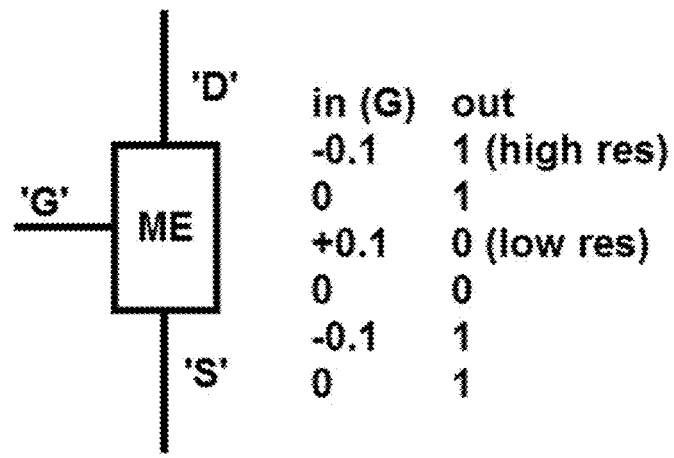
FIGS. 5A and 5B show logic representations of a ME-FET.
Figure 5B:
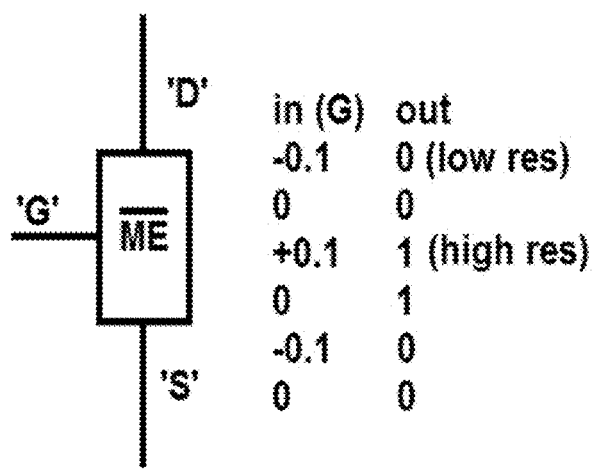

The ME-FETs of FIGS. 1A and 1B can be represented by a logic block. In particular, FIGS. 5A and 5B show logic representations of a ME-FET. FIG. 5A indicates upward interface polarization and FIG. 5B indicates downward interface polarization. In the ME-FETs of FIGS. 1A and 1B, an interface polarization occurs between the ME layer and the narrow channel conductor layer when voltage is applied to the source terminal, drain terminal, and gate electrode. The direction of the interface polarization can be upward or downward. Operation of the device is indicated in the legend shown in the Figures.

The efficiency of these basic devices can be improved to result in lower power consumption, increased performance, and reduced area. Such improvements can be possible by taking in two different spins, referred to as "up" and "down" spins. The "up" spin and "down" spin can be gated with a single gate.

Figure 5C:
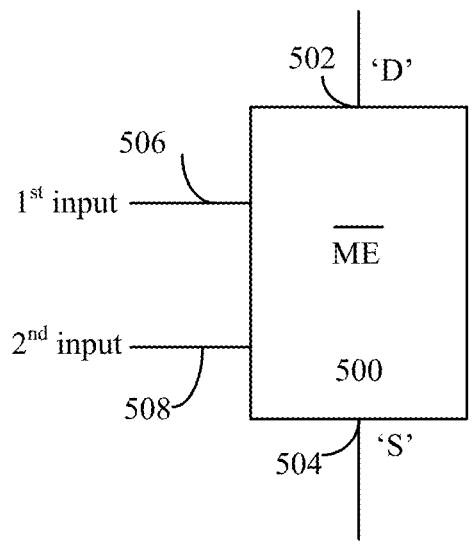
FIG. 5C shows a logic representation of a ME-FET with a two-input gate.

FIG. 5C shows a logic representation of a ME-FET with a two-input gate. The two-input ME-FET 500 can have a drain terminal 502, a source terminal 504, a first input gate terminal 506, and a second input gate terminal 508.

Figure 5D:
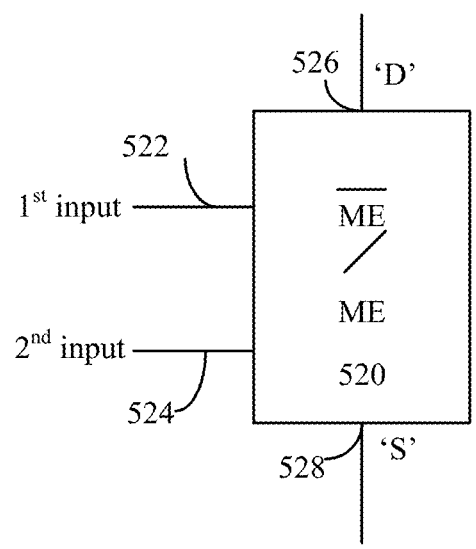
FIG. 5D shows a logic representation of a ME-FET with a split gate scheme.
Figure 6A:
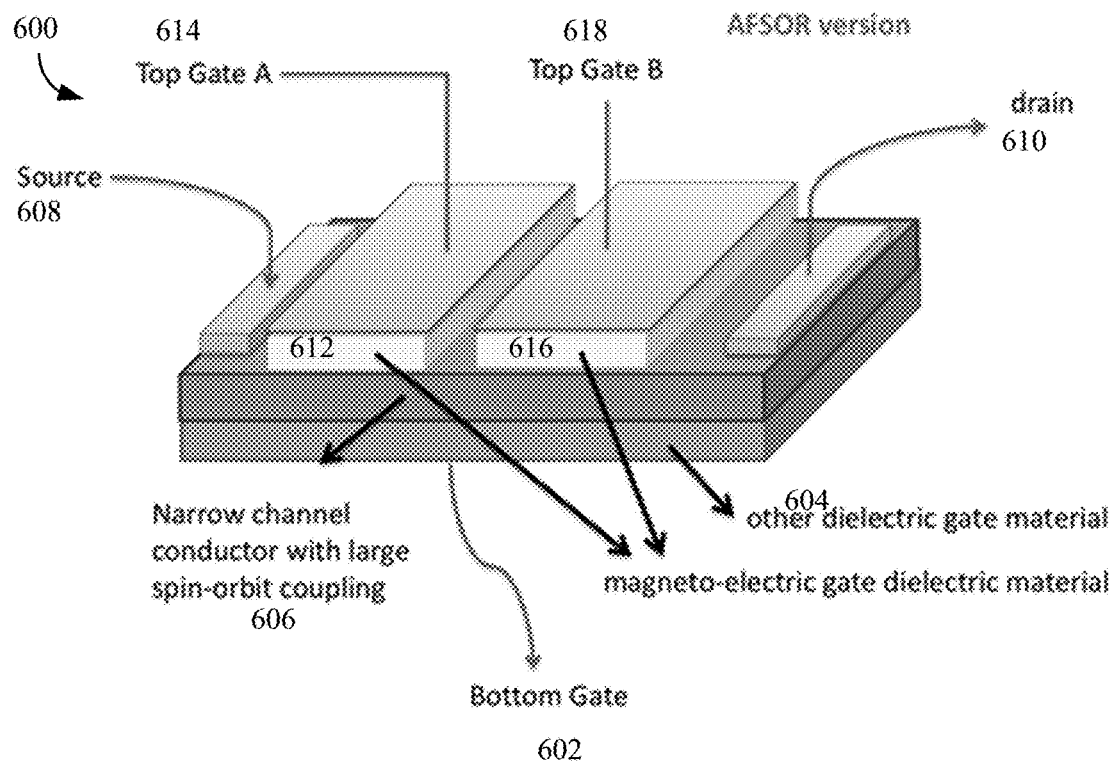
FIG. 6A shows a cross-sectional view of an AFSOR ME-FET with a split gate scheme.
Figure 6B:
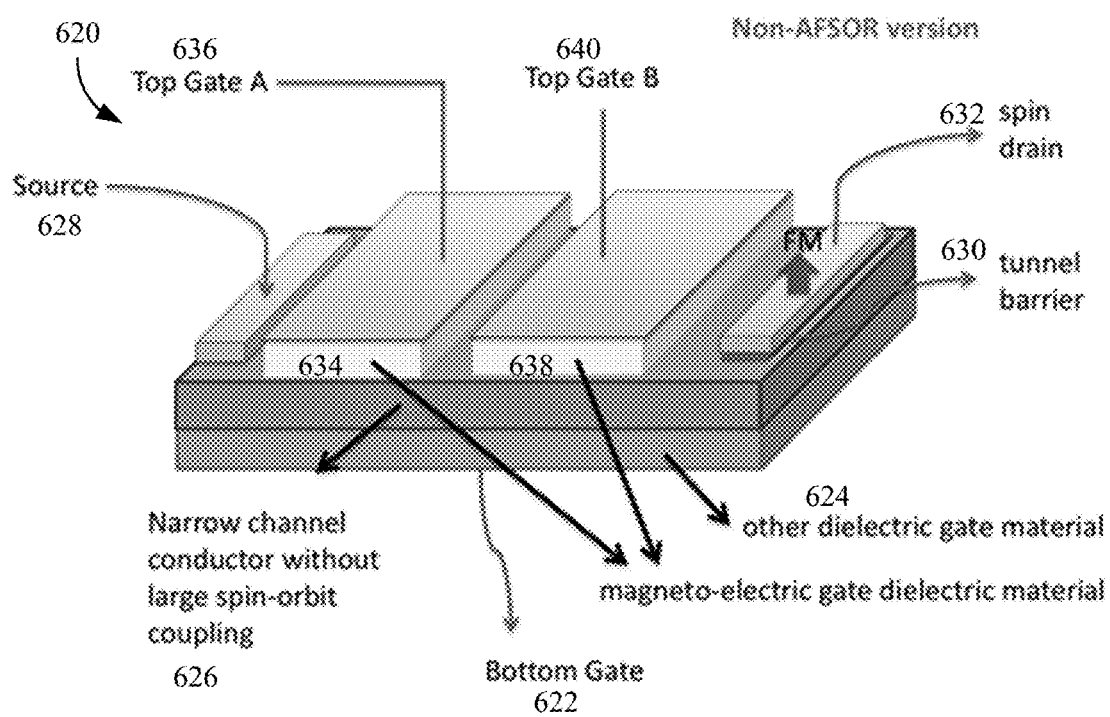
FIG. 6B shows a cross-sectional view of a non-AFSOR ME-FET with a split gate scheme.

Further improvements, beyond the two-input single gate, can be achieved using a split gate scheme. FIG. 5D shows a logic representation of a ME-FET 520 with a split gate scheme. The split gate architecture provides two inputs to the ME-FET. In a split gate architecture, the gate electrode can be split into two gate electrodes, a first input terminal 522 and a second input terminal 524, in series between the drain terminal 526 and source terminal 528. Two example implementations of a ME-FET with split gate scheme are shown in FIGS. 6A and 6B. In place of a single polarized ME spin state (e.g., "up" or "down"), both states can be introduced in the same split gate device. This means the split gate device can act as a ME-XNOR device with each gate having either up polarization, containing an element shown as a ME-device (as shown in FIG. 5A) or down polarization, containing an element shown as a ME-bar device (as shown in FIG. 5B), simultaneously. The direction of the spin is dependent on the input voltage. For example, if both inputs are high, then the "up" spin will go through, causing a lower resistance on the output. If both inputs are low, the output will also have a low resistance. If one input is high and the other input is low, the output will have a high resistance.

The split gate architecture can be implemented in both an AFSOR device and a non-AFSOR device. FIG. 6A shows a cross-sectional view of an AFSOR ME-FET with a split gate scheme, while FIG. 6B shows a cross-sectional view of a non-AFSOR ME-FET with a split gate scheme. In the example implementation of FIG. 6A, the AFSOR ME-FET 600 comprises a bottom gate 602 coupled to a dielectric gate material layer 604, a narrow channel conductor layer with large spin-orbit coupling 606 on the dielectric gate material layer 604. A source terminal 608 is positioned on the narrow channel conductor layer 606 at a side and drain terminal 610 is positioned on the narrow channel conductor 606 at another side. A first ME gate dielectric 612 on the narrow channel conductor layer 606 is positioned below the first portion of the split gate 614 and a second ME gate dielectric 616 on the narrow channel conductor layer 606 is positioned below the second portion of the split gate 618.

In the example implementation of FIG. 6B, a non-AFSOR ME-FET 620 comprises a bottom gate 622 coupled to a dielectric gate material 624, a narrow channel conductor layer without large spin-orbit coupling 626 on the dielectric gate material layer 624. A source terminal 628 is positioned on the narrow channel conductor 626 at a side and a tunnel barrier layer 630 is positioned on the narrow channel conductor 626 at another side. A drain terminal 632 is positioned on the tunnel barrier layer 630. A first ME gate dielectric 634 on the narrow channel conductor layer 626 is positioned below the first portion of the split gate 636 and a second ME gate dielectric 638 on the narrow channel conductor layer 626 is positioned below the second portion of the split gate 640. In both the AFSOR and non-AFSOR devices, the spacing between the split gates may be determined by the materials used in the device and should be as physically close as the materials allow.

Various logic circuits can be made using the ME-FETs of FIGS. 1A and 1B (also represented in the logic representations of ME-FETs in FIGS. 5A and 5B). The following Figures and description show some examples of CMOS logic circuits and their equivalent logic function implemented using ME-FETs.

FIG. 7A shows a prior art implementation of a CMOS XOR circuit and FIG. 7B shows the equivalent circuit using ME-FET devices. As shown in FIG. 7A, the CMOS XOR requires twelve components to perform the XOR logic operation. Replacing the CMOS transistors with ME-FET devices can reduce the component count to five, including clocking. This represents an area improvement of over 60%, assuming similar size transistors. This is equivalent to almost 1.5 process nodes. Referring to FIG. 7B, the ME XOR logic circuit 700 includes a pull-up transistor 702 and four ME-FET devices (704, 706, 708, 710). The first ME-FET device 704 has downward interface polarization and includes a first gate terminal 712 for a first input signal, a first drain terminal 714 coupled to a drain terminal of the pull-up transistor 702, and a first source terminal 716. The second ME-FET device 706 also has downward interface polarization and includes a second gate terminal 718 for a second input signal, a second drain terminal 720 coupled to the first source terminal 716 of the first ME-FET 704, and a second source terminal 722 coupled to a ground line 724. The third ME-FET device 708 has upward interface polarization and includes a third gate terminal 726 for the first input signal, a third drain terminal 728 coupled to the drain terminal of the pull-up transistor 702, and a third source terminal 730. The fourth ME-FET device 710 has upward interface polarization and includes a fourth gate terminal 732 for the second input signal, a fourth drain terminal 734 coupled to the third source terminal 730 of the third ME-FET 708, and a fourth source terminal 736 coupled to the ground line 724. During XOR operation, a voltage source, VDD, can be applied to a source terminal of the pull-up transistor 702 and a clocking signal can be received at a gate terminal of the pull-up transistor 702.

Figure 8:
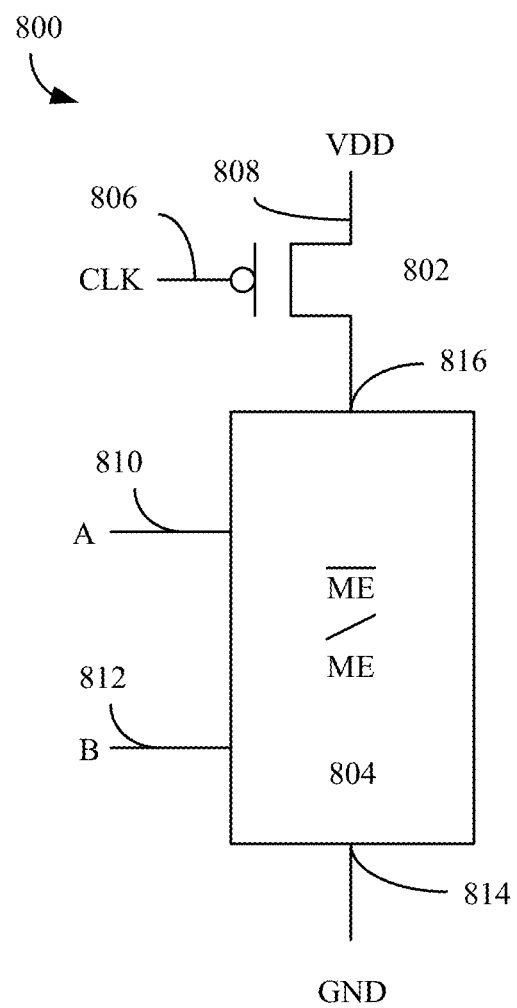
FIG. 8 shows an example implementation of a ME XNOR device using a split gate scheme.

The example implementation of the ME-FET XOR in FIG. 7B uses a combination of basic ME-FETs and a pull-up transistor to realize the XOR logic operation. These basic ME-FETs include a single input signal coupled to a single-input gate terminal. Replacing the basic ME-FETs with the split gate devices of FIGS. 6A and 6B can improve performance by reducing component count from 4 ME-FETs to a single split gate ME-FET and pull-up transistor. FIG. 8 shows an example implementation of a ME XNOR device using a split gate scheme. The ME XNOR device 800 includes a pull-up transistor 802 and a ME-FET device 804. The pull-up transistor 802 is coupled to receive a clocking signal, CLK, and a gate terminal 806 and coupled at a source terminal 808 to a voltage source, VDD. The ME-FET device 804 includes a split gate, a first gate terminal 810 coupled to a first portion of the split gate for receiving a first input signal, a second gate terminal 812 coupled to a second portion of the split gate for receiving a second input signal, a source terminal 814 coupled to a ground line, and a drain terminal 816 coupled to a drain terminal of the pull-up transistor 802.

A majority gate logic device can be very efficient in terms of speed, area, and power consumption and can be seen to be even more efficient when built into a full adder device. The output of the majority gate logic is a "carry" function, which can be an important performance feature. The majority gate logic can be performed using the two-input device of FIG. 5D. A technology progression, in terms of efficiency and area consumption, can be shown in FIGS. 9A, 9B, and 9D. FIG. 9A shows a prior art implementation of a CMOS majority gate logic circuit and FIG. 9B shows the equivalent circuit using ME-FET devices. The CMOS circuit of FIG. 9A requires 13 components. The area of a majority gate logic circuit can be reduced by over 50% using ME-FET devices rather than CMOS, assuming similar size transistors. This is equivalent to greater than one process node. As shown in FIG. 9B, the ME majority gate count has six components including clocking. The ME majority gate device 900 includes a pull-up transistor 902 and five single-input basic ME-FET devices (904, 906, 908, 910, 912). Each of the ME-FET devices has downward interface polarization. The first ME-FET device 904 includes a first gate terminal 914 for a first input signal, a first drain terminal 916 coupled to a drain terminal of the pull-up transistor 902, and a first source terminal 918. The second ME-FET device 906 includes a second gate terminal 920 for a second input signal, a second drain terminal 922 coupled to the first source terminal 918 of the first ME-FET device 904, and a source terminal 924 coupled to a ground line 926. A third ME-FET device 908 includes a third gate terminal 928 for a third input signal, a third drain terminal 930 coupled to the drain terminal of the pull-up transistor 902, and a third source terminal 932. The fourth ME-FET device 910 includes a fourth gate terminal 934 for the second input signal, a fourth drain terminal 936 coupled to the third source terminal 932 of the third ME-FET device 908, and a fourth source terminal 938 coupled to the ground line 926. The fifth ME-FET device 912 includes a fifth gate terminal 940 for the first input signal, a fifth drain terminal 942 coupled to the third source terminal 932 of the third ME-FET device 908, and a fifth source terminal 944 coupled to the ground line 926.

The ME majority gate device can be further improved in a similar way to the improved ME XNOR device of FIG. 8 using a split gate scheme for component reduction. FIG. 9C shows a truth table for a majority gate logic device and FIG. 9D shows an example implementation of the majority gate logic device 950 with component reduction. The logic truth table of FIG. 9C can be split to show that regardless of the state of the "C" output, if both "A" and "B" are at a logic level "1" or at a logic level "0", the output of the majority gate is the same as the "A" and "B" states. This can define the left-hand path of FIG. 9D, which is represented as a ME AND gate 952 with a 2-input single gate. For the state when "A" and "B" are different, the output is the same state as "C", which can be created with the right-hand path. The right-hand path of FIG. 9D can be represented by a ME-transmission gate 954 and a ME-XNOR gate 956. Additionally, a pull-up transistor 958 can be used for providing power to the circuit and is coupled to receive a clocking signal at a gate terminal 960 and coupled at a source terminal 962 to a voltage source, VDD. The ME AND gate 952 has downward interface polarization and can include a gate, a first terminal 964 coupled to the gate for receiving a first input signal, a second terminal 966 coupled to the gate for receiving a second input signal, a source terminal 968 coupled to a ground line 970, and a drain terminal 972 coupled to a drain terminal 974 of the pull-up transistor 958. The ME-transmission gate 954 has downward interface polarization and includes a gate 976 coupled to receive a third input signal, a drain terminal 978 coupled to the drain terminal 974 of the pull-up transistor 958, and a source terminal 980. The ME-XNOR device 956 can include a split gate, a first gate terminal 982 coupled to a first portion of the split gate for receiving the first input signal, a second gate terminal 984 coupled to a second portion of the split gate for receiving the second input signal, a source terminal 986 coupled to the ground line 970, and a drain terminal 988 coupled to the source terminal 980 of the ME-transmission gate 954. The example majority gate circuit of FIG. 9D can result in a component reduction from the standard ME-FET circuit of FIG. 9B, reducing the component count from six to four, which can be a further 50% reduction, and can result in a reduction to less than 30% of the area of the example CMOS majority gate circuit of FIG. 9A.

FIG. 10 shows a single source ME-FET inverter. Referring to FIG. 10, a single source ME-FET inverter 1000 can be implemented using a single ME-FET device 1010 and a pull-up transistor 1020. An input at the gate 1011 of the ME-FET device 1010 can be read at the drain 1012 of the ME-FET device 1010 under control of a clock signal for the pull-up transistor 1020.

Figure 11B:
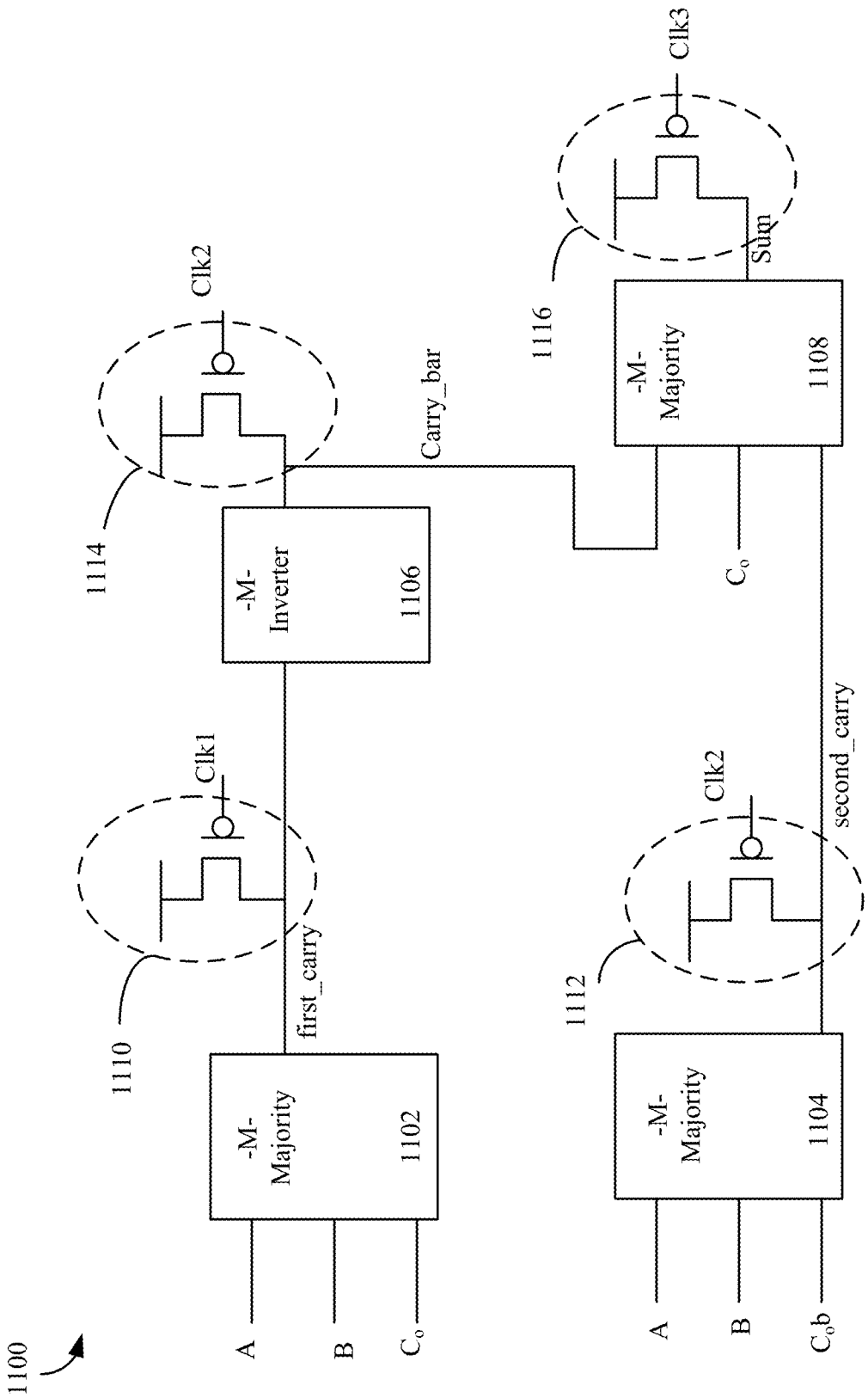
FIG. 11B shows an equivalent circuit to the circuit of FIG. 11A using ME logic gate devices.

FIG. 11A shows a prior art implementation of a full adder using CMOS and FIG. 11B shows an equivalent circuit using ME logic gate devices.

Referring to FIG. 11B, a ME full adder 1100 can include a first ME majority gate device 1102 coupled to receive a first input signal, a second input signal, and a third input signal and output a first "carry" signal; a second ME majority gate device 1104 coupled to receive the first input signal, the second input signal, and a fourth input signal and output a "second carry" signal; a ME inverter device 1106 coupled to receive the "first carry" signal from the first ME majority gate device 1102 and output a "carry_bar" signal; and a third ME majority gate device 1108 coupled to receive the "carry_bar" signal from the ME inverter device 1106, the third input signal, and the "second carry" signal from the second ME majority gate device 1104 and output a "sum" signal. The pull-up transistors for the clocks (e.g., first pull-up transistor 1110, first pull-up transistor 1112, first pull-up transistor 1114, first pull-up transistor 1116) are shown outside the ME logic blocks. In some cases, the majority gate devices may be implemented as described with respect to the ME majority gate logic circuit of FIG. 9B. In some cases, the majority gate devices may be implemented as described with respect to the ME majority gate logic circuit of FIG. 9D. In some cases, the ME inverter device can be implemented as described with respect to the ME-FET inverter of FIG. 10. As shown in FIG. 11A, a conventional CMOS full adder can require 28 components. Replacing the CMOS components with the ME gate devices implemented according to FIGS. 9D and 10 reduces the component count to 20, including clocking. This can represent an area of improvement of almost 30%, assuming similar size transistors.

In some cases, the full adder logic circuit can also be implemented using AFSOR devices following a similar configuration as described with respect to FIGS. 9B and 9D. In some cases, the AFSOR majority gate devices can be implemented as described with respect to the ME minority gate of FIG. 4 with the addition of the inverter at the output. In some of such cases, the AFSOR inverter device can be implemented as described with respect to FIGS. 3A and 3B.

Figure 12A:
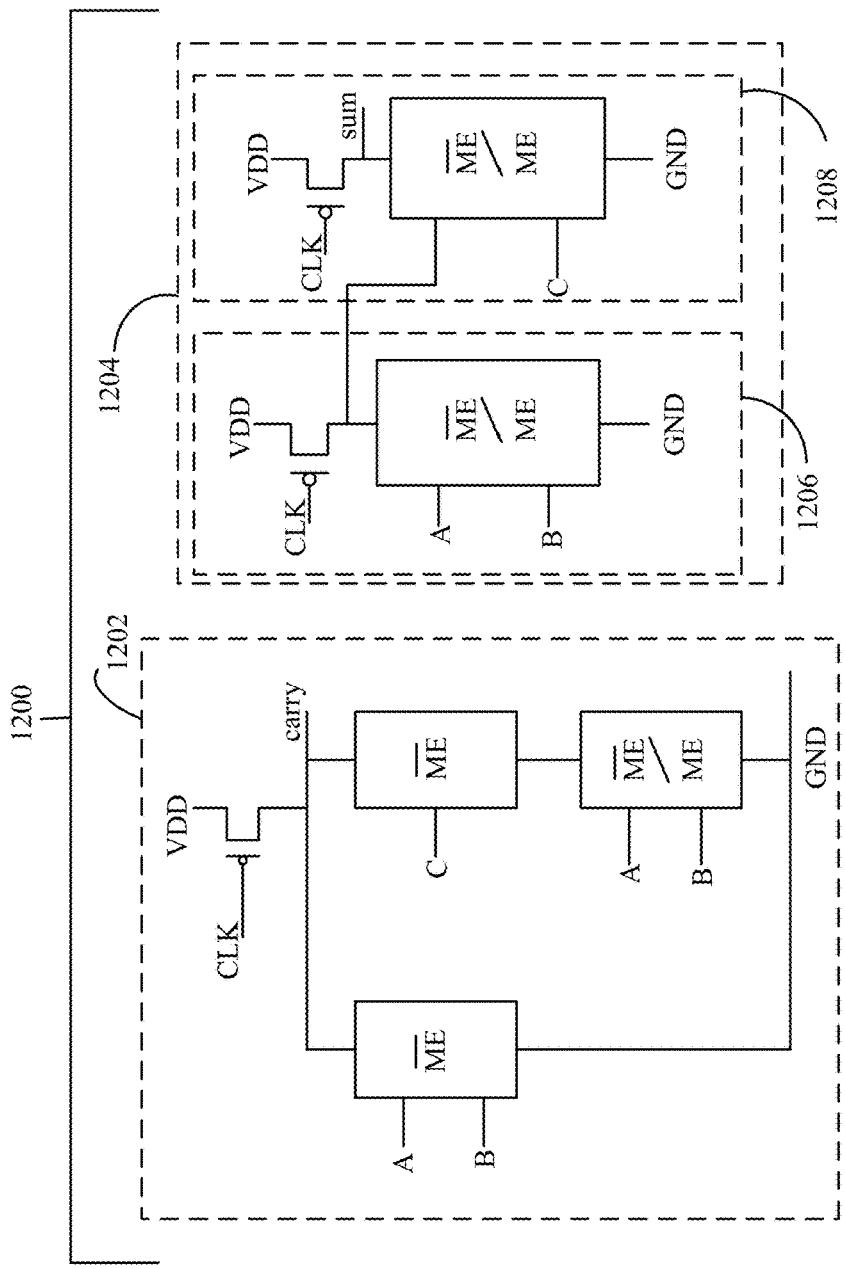
FIG. 12A shows a schematic representation of an example implementation of a ME full adder device using split gates.
Figure 12B:
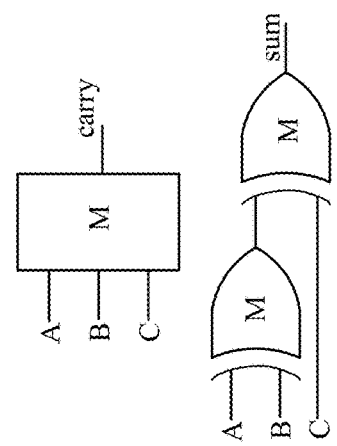
FIG. 12B shows a block diagram of a logical representation of the example implementation of FIG. 12A.

The gate count of the full adder can be further reduced by using the split gate scheme. FIG. 12A shows a schematic representation of an example implementation of a ME full adder device using split gates. In the configuration of FIG. 12A, the ME majority gate as described in FIG. 9B and the ME XNOR as described in FIG. 8 are used to construct the ME full adder device. Using these simplified ME gates can reduce the number of components used for the full adder down to 8, which can reduce the circuit area to less than 30% the area of the CMOS full adder circuit represented in FIG. 11A. Referring to FIG. 12A, the ME full adder device 1200 includes a ME majority gate device 1202 and a stacked ME-XNOR device 1204. The ME majority gate device 1202 is coupled to receive a first input signal, a second input signal, and a third input signal and output a "carry" signal. The stacked ME-XNOR device 1204 includes a first ME-XNOR device 1206 and a second ME-XNOR device 1208, wherein the first ME-XNOR device 1206 is coupled to receive the first input signal and second input signal and output an intermediate signal, and wherein the second ME-XNOR device 1208 is coupled to receive the third input signal and the intermediate signal and output a "sum" signal. FIG. 12B shows a block diagram of a logical representation of the example implementation of FIG. 12A.

Although reference is made to specific ME-FET implementations, other ME transistors, including ferroelectrically gated ME devices and ME devices with bimodal conduction of spin or magnetization, may be suitable for the described circuit configurations.

All of the ME gates described in the example implementations above (e.g., all examples described and illustrated with respect to the Figures herein) can be included as standard cells in a standard design library. A standard design library can include, for example, hundreds of cells that can be selectively combined to design a larger circuit. Standard cell libraries can be created for CMOS, AFSOR, non-AFSOR, and other technologies. Each cell in the library can be associated with a specific logic function such as AND, OR, XOR, XNOR. Each logic function may be implemented in one or more predefined cells. For example, a logic function may have multiple layouts, each having different characteristics. For example, a design library can include a standard cell for a XNOR logic function. One of the multiple layouts available could include a ME-XNOR gate that includes a pull-up transistor and a split gate ME-FET. The pull-up transistor can be coupled to receive a clocking signal at a gate terminal and coupled at a source terminal to receive a voltage source. The ME-FET can include a split gate, a first gate terminal coupled to a first portion of the split gate for receiving a first input signal, a second gate terminal coupled to a second portion of the split gate for receiving a second input signal, a source terminal coupled to receive a ground line, and a drain terminal coupled to a drain terminal of the pull-up transistor.

A design library could also include a standard cell for a majority gate function. One of the multiple layouts available can include a ME majority gate that includes a pull-up transistor, a ME AND gate device, a ME-transmission gate, and a ME-XNOR gate. The pull-up transistor is coupled to receive a clocking signal at a gate terminal and coupled at a source terminal to receive a voltage source. The ME AND gate has downward interface polarization and includes a gate, a first terminal coupled to the gate for receiving a first input signal, a second terminal coupled to the gate for receiving a second input signal, a source terminal coupled to receive a ground line, and a drain terminal coupled to a drain terminal of the pull-up transistor. The ME-transmission gate has downward interface polarization and includes a gate terminal coupled to receive a third input signal, a drain terminal coupled to the drain terminal of the pull-up transistor, and a source terminal. The ME-XNOR gate device includes a split gate, a first gate terminal coupled to a first portion of the split gate for receiving the first input signal, a second gate terminal coupled to a second portion of the split gate for receiving the second input signal, a source terminal coupled to receive the ground line, and a drain terminal coupled to the source terminal of the ME-transmission gate device.

In another example, a design library could also include a standard cell for a full adder logic function and one of the available layouts could be a ME full adder that includes a ME majority gate device and a stacked ME-XNOR device. The ME majority gate device is coupled to receive a first input signal, a second input signal, and a third input signal and output a "carry" signal. The stacked ME-XNOR device includes a first ME-XNOR device and a second ME-XNOR device, wherein the first ME-XNOR device is coupled to receive the first input signal and second input signal and output an intermediate signal, and the second ME-XNOR device is coupled to receive the third input signal and the intermediate signal and output a "sum" signal.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

We claim:

1. A magneto-electric (ME) full adder comprising:
a ME majority gate device coupled to receive a first input signal, a second input signal, and a third input signal and output a "carry" signal, wherein the ME majority gate device comprises a ME AND gate device with downward interface polarization, a ME-transmission gate device with downward interface polarization, and a ME-XNOR gate device, wherein the ME AND gate device with downward interface polarization comprises:
a gate;
a first terminal coupled to the gate for receiving a first input signal;
a second terminal coupled to the gate for receiving a second input signal;
a source terminal coupled to a ground line; and
a drain terminal coupled to a conducting device,
wherein the ME-transmission gate device with downward interface polarization comprises:
a transmission gate terminal coupled to receive a third input signal;
a transmission drain terminal coupled to the conducting device; and
a transmission source terminal,
wherein the ME-XNOR gate device comprises:
a split gate;
a first gate terminal coupled to a first portion of the split gate for receiving the first input signal;
a second gate terminal coupled to a second portion of the split gate for receiving the second input signal;
a source terminal coupled to the ground line; and
a drain terminal coupled to the transmission source terminal of the ME-transmission gate device; and
a stacked ME-XNOR device comprising a first ME-XNOR device and a second ME-XNOR device, wherein the first ME-XNOR device is coupled to receive the first input signal and second input signal and output an intermediate signal, and wherein the second ME-XNOR device is coupled to receive the third input signal and the intermediate signal and output a "sum" signal, wherein the first ME-XNOR device and the second ME-XNOR device each comprise an associated conducting device and an associated ME transistor coupled to the associated conducting device.

2. A magneto-electric (ME) full adder comprising:
a ME majority gate device coupled to receive a first input signal, a second input signal, and a third input signal and output a "carry" signal, wherein the ME majority gate device comprises a conducting device and a plurality of ME transistors, wherein at least one ME transistor of the plurality of ME transistors is coupled to the conducting device; and
a stacked ME-XNOR device comprising a first ME-XNOR device and a second ME-XNOR device, wherein the first ME-XNOR device is coupled to receive the first input signal and second input signal and output an intermediate signal, and wherein the second ME-XNOR device is coupled to receive the third input signal and the intermediate signal and output a "sum" signal, wherein the first and second ME-XNOR devices each comprise:
an associated ME transistor, wherein the associated ME transistor comprises:
a split gate;
a first gate terminal coupled to a first portion of the split gate for receiving a first particular input signal, the first particular input signal being the first input signal for the first ME-XNOR device and the third input signal for the second ME-XNOR device;
a second gate terminal coupled to a second portion of the split gate for receiving a second particular input signal, the second particular input signal being the second input signal for the first ME-XNOR device and the intermediate signal for the second ME-XNOR device;
a source terminal coupled to a ground line; and
a drain terminal coupled to an associated conducting device.

3. A magneto-electric (ME) full adder comprising:
a first ME majority gate device coupled to receive a first input signal, a second input signal, and a third input signal and output a "first carry" signal;
a second ME majority gate device coupled to receive the first input signal, the second input signal, and a fourth input signal and output a "second carry" signal;
a ME inverter device coupled to receive the "first carry" signal from the first ME majority gate device and output a "carry_bar" signal; and
a third ME majority gate device coupled to receive the "carry_bar" signal from the ME inverter device, the third input signal, and the "second carry" signal from the second ME majority gate device and output a "sum" signal,
wherein the first ME majority gate device comprises a first conducting device and a plurality of first ME transistors, wherein at least one first ME transistor of the plurality of first ME transistors is coupled to the first conducting device,
wherein the second ME majority gate device comprises a second conducting device and a plurality of second ME transistors, wherein at least one second ME transistor of the plurality of second ME transistors is coupled to the second conducting device,
wherein the ME inverter device comprises a conducting device and a ME transistor coupled to the conducting device, and
wherein the third ME majority gate device comprises a third conducting device and a plurality of third ME transistors, wherein at least one third ME transistor of the plurality of third ME transistors is coupled to the third conducting device.

4. The ME full adder of claim 1, wherein respective associated conducting devices for each of first ME-XNOR device and the second ME-XNOR device are pull-up transistors.

5. The ME full adder of claim 1, wherein respective associated conducting devices for each of first ME-XNOR device and the second ME-XNOR device are resistors, MOS transistors, or bipolar transistors.

6. The ME full adder of claim 1, wherein the conducting device of the ME majority gate device is a resistor, MOS transistor, or bipolar transistor.

7. The ME full adder of claim 2, wherein respective associated conducting devices for each of first ME-XNOR device and the second ME-XNOR device are pull-up transistors.

8. The ME full adder of claim 2, wherein respective associated conducting devices for each of first ME-XNOR device and the second ME-XNOR device are resistors, MOS transistors, or bipolar transistors.

9. The ME full adder of claim 2, wherein the conducting device of the ME majority gate device is a resistor, MOS transistor, or bipolar transistor.

* * * * *